United States Patent
Nakano

[11] Patent Number: 5,905,256
[45] Date of Patent: May 18, 1999

[54] IMAGING DEVICE INCLUDING OUTPUT AMPLIFIER CIRCUIT HAVING VARIABLE GAIN BANDWIDTH PRODUCT

[75] Inventor: Takashi Nakano, Tokyo, Japan

[73] Assignee: NEC Corporation, Tokyo, Japan

[21] Appl. No.: 08/854,555

[22] Filed: May 12, 1997

[30] Foreign Application Priority Data

May 13, 1996 [JP] Japan .................................. 8-118091

[51] Int. Cl.[6] .................................................. H01J 40/14
[52] U.S. Cl. ......................................... 250/214 A; 330/308
[58] Field of Search ........................... 250/214 A, 214 R, 250/208.1; 330/277–279, 310, 59, 308; 348/283, 300–302, 308

[56] References Cited

U.S. PATENT DOCUMENTS 5,285,171 2/1994 Bult et al. ............................... 330/277
5,600,451 2/1997 Maki ..................................... 250/214 A

FOREIGN PATENT DOCUMENTS 4-298176 10/1992 Japan .

*Primary Examiner*—Que T. Le
*Attorney, Agent, or Firm*—Whitham, Curtis & Whitham

[57] ABSTRACT

An imaging device of the present invention comprises driver transistors $23_1$ through $23_n$ and load transistors $24_1$ through $24_n$. The imaging device has a switch switching output of the driver transistor 23n-1 to output terminal Vout 2 or to the driver transistor 23n as an output signal.

18 Claims, 14 Drawing Sheets

IMAGING DEVICE INCLUDING OUTPUT AMPLIFIER CIRCUIT HAVING VARIABLE GAIN BANDWIDTH PRODUCT

BACKGROUND OF THE INVENTION

The present invention relates to an imaging device and, more particularly, to an improvement in an output circuit incorporated in a solid-state image pick-up device such as a charge-coupled device (CCD).

The CCD is widely used as a solid-state imaging device to convert light into electric signals. The CCD is therefore incorporated into video cameras, facsimiles and so on. In order to output electric signals, the CCD has an output amplifier which is disclosed in Japanese Patent Laid-Open Application No. 4-298176 for example. The output amplifier disclosed therein employs transistors, each of which is of a surface type. For this reason, there occurs a problem that the noise of the output amplifier is large.

To solve such problem, a new output amplifier has been invented by a co-pending patent application Ser. No. 568,930/08 which was filed on Dec. 7, 1995.

Referring FIG. 14, there is shown a high-vision CCD employing such new output amplifier. This CCD has photodiodes 19, vertical CCD registers 20, and a horizontal CCD register 21. An output amplifier 22 is connected to the horizontal CCD register 21. A signal photoelectric-converted by the photodiode 19 is transferred via the respective vertical CCD register 20 into the horizontal CCD register 21 and is amplified by the output amplifier 22 to produce an output signal. The vertical and the horizontal registers are driven a driving signal respectively.

The output amplifier 22, as shown in FIG. 15, employs three-stage source-follower amplifier circuit on chip. The output amplifier 22 has three driver transistors 23, three load transistors 24, a $V_{DD}$ terminal 2, a GND terminal 6, and a $V_{out}$ terminal 12. An input terminal of the output amplifier 22 is connected to a floating connection or floating junction (FJ) capacitor 25 and a RESET transistor 26 having a RESET drain terminal 27. The driver transistor of the first stage is formed by surface type in order to hold linearity thereof. The other transistors are formed by buried or embedded type to reduce noise.

Signals applied from the horizontal CCD register 21 is supplied to the connection node of the FJ capacitor 25 and the RESET transistor 26. After the signals is amplifiered by the output amplifier 22, the RESET transistor 26 is active and the level of the connection node of the FJ capacitor 25 and the RESET transistor 26 is equalized with the level applied to the RESET drain terminal 27.

At present, CCD cameras with a multifunction have been developed so that they correspond to multimedia techniques. There therefore is a demand for an application such as photographing a dynamic image or a moving picture and a still image or a still picture with the same camera.

When a still image is photographed or picked out, the CCD camera does not need to drive with a high speed compared with that when a dynamic image is photographed. That is, the vertical and the horizontal registers do not need to drive by the driving signal with high frequency in a still image photographing mode. Therefore, the drive frequency in a still image photographing mode can become low compared with a dynamic image photographing mode. However, the characteristic of the conventional output amplifier has been arranged with the dynamic image photographing mode. Therefore, a conventional semiconductor device incurs waste of gain bandwidth product and consumption of power when it drives in a still image photographing mode.

SUMMARY OF THE INVENTION

Accordingly, it is the object of the present invention to provide a semiconductor device which is capable of eliminating the aforementioned waste.

It is another object of the present invention to provide an output amplifier keeping up with a still image photographing mode and a dynamic image photographing mode.

An imaging device of the present invention comprises an amplifier circuit receiving an input signal and producing an output signal, the amplifier circuit comprising a first source-follower amplifier receiving the input signal to produce a first internal output signal, a second source-follower amplifier circuit amplifying an internal input signal to produce a second internal output signal; and changing means changing a gain bandwidth product of the amplifier circuit.

An imaging device of the other present invention, amplifying an input signal to produce an output signal, comprises, a first power supply terminal, a second power supply terminal, first and second nodes, a first transistor of a first channel type connected between the first power supply terminal and the first node and having a first control electrode receiving an input signal, a second transistor of the first channel type connected between the first node and the second power supply terminal and having a second control electrode, a third transistor of the first channel type connected between at least one of the first power supply terminal and the second power supply terminal and the second node and having a third control electrode, a fourth transistor of the first channel type connected between the second node and the second power supply terminal and having a fourth control electrode, and changing means changing a gain bandwidth product of the amplifier circuit.

BRIEF DESCRIPTION OF THE DRAWINGS

This above-mentioned and other objects, features and advantages of the present invention will become more apparent from the following detailed description in conjunction with the accompanying drawings, wherein:

FIGS. 4A–B are top views showing the essential part of the semiconductor device of the first embodiment of the present invention, FIG. 4C is a top view showing the essential part of a conventional semiconductor device;

FIG. 11A is a top view showing the part of a semiconductor device according to a third embodiment of the present invention, FIG. 11B is a top view showing the part of a conventional semiconductor device;

DETAILED DESCRIPTION OF THE PREFERRED EMBODIMENTS

Figure 16:
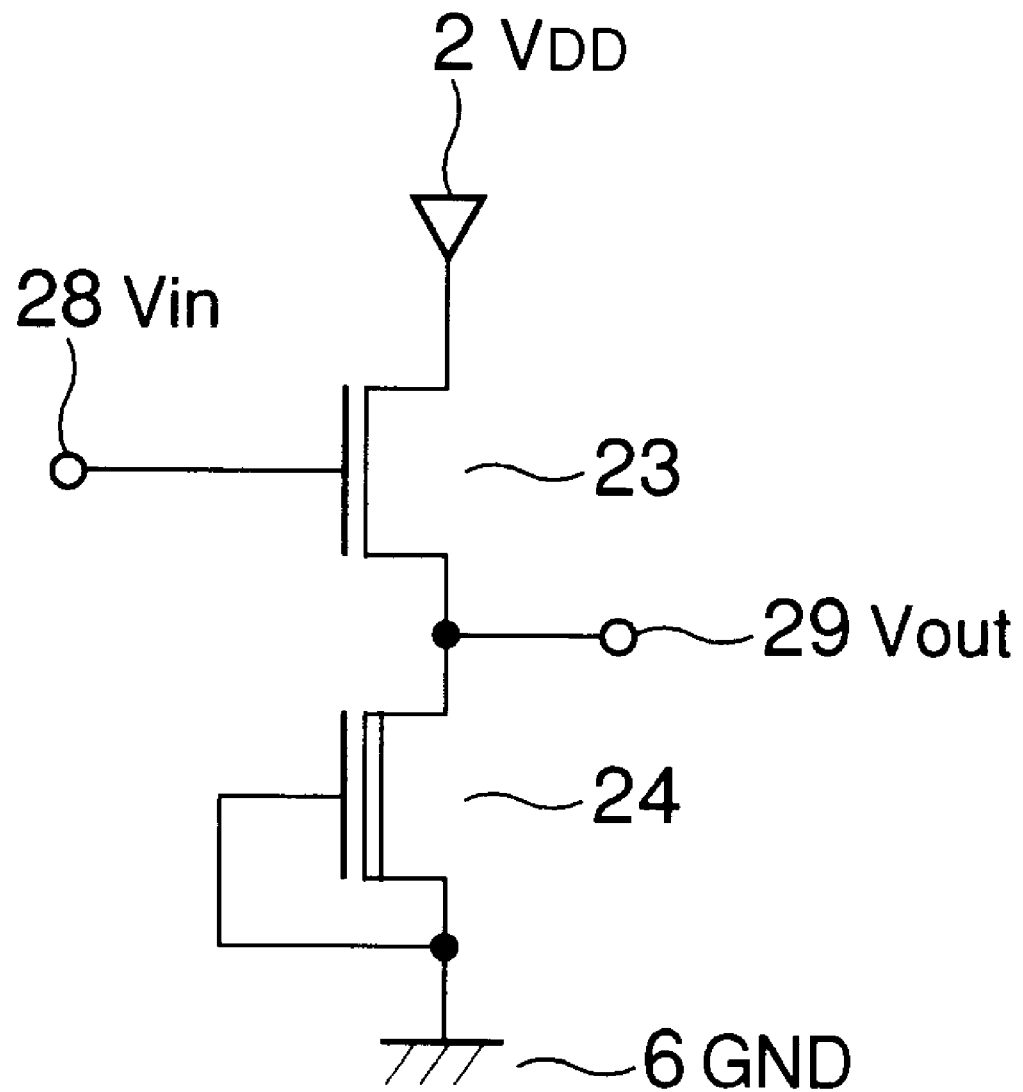
FIG. 16 is a diagram showing the structure of the source-follower amplifier.

As shown in FIG. 16, the principle of the present invention will be explained before the embodiments of the present invention will be explained.

The mutual conductance $gm_D$ of the driver transistor 23 of a source-follower amplifier is expressed as:

$$gm_D = \mu_D \cdot Cox_D \cdot (W_D/L_D) \cdot (V_i - V_o - Vt_D) \quad (1)$$

where $\mu_D$ is the mobility of the driver transistor 23, $W_D$ is the gate width, $L_D$ is the gate length, $Cox_D$ is the gate capacity, $Vt_D$ is the threshold voltage, $V_i$ is the input voltage, and $V_o$ is the output voltage.

The band ft, which is defined as a frequency where the amplification factor reduces by 3 dB as compared with the amplification factor of a dc component (gain bandwidth product), is expressed as:

$$ft = 2 \cdot \pi gm_D / C \quad (2)$$

where C is the load capacity.

The load capacity C consists of the input capacity of the driver transistor of the next stage and the wiring capacity. The final stage becomes larger in load capacity than other stages, because it is connected to an external circuit.

Consumption current I is determined by a load transistor 24 functioning as a constant current source and is expressed as:

$$I = (\tfrac{1}{2}) \cdot \mu_L \cdot Cox_L \cdot (W_L/L_L) \cdot (Vgs_L - Vt_L)^2 \quad (3)$$

where $\mu_L$ is the mobility of the load transistor 24, $W_L$ is the gate width, $L_L$ is the gate length, $Cox_L$ is the gate capacity, $Vt_L$ is the threshold voltage, and $Vgs_L$ (in the conventional example shown in FIG. 14, $Vgs_L$ is fixed at 0 V) is the gate-source voltage.

Gain G is expressed as:

$$G = gm_D / (gm_D + gm_b + gds_D + gds_L) \quad (4)$$

where $gm_b$ is the mutual conductance of the back gate of the driver transistor 23, $gds_D$ is the conductance of the driver transistor 23, and $gds_L$ is the conductance of the load transistor 24.

If Eqs.(1) and (3) are substituted into Eq.(4), the gain G can be written as:

$$G = (c \cdot W_D) / (a \cdot W_D + b \cdot W_L) \quad (5)$$

where a is the coefficient of $W_D$ of the numerator, b is the coefficient of $W_L$, and c is the coefficient of $W_D$ of the denominator.

The operating point of the output voltage $V_o$ from an output terminal 29 is determined by the resistance ratio of the driver transistor 23 and the load transistor 24.

Generally, source-follower amplifiers are stacked in some stages and employed in a section which sends the output signal to an external circuit, in order to reduce the output impedance. In such a multi-stage source-follower amplifier circuit, the $gm_D$ of Eq.(1) is made larger by making the $W_D/L_D$ of the driver transistor 23 larger in sequence from the foremost stage. With the increased $gm_D$, the band expressed by Eq.(2) can be made approximately constant against the fact that the load capacity becomes larger toward the latter stage (This means is referred to as band fixing means).

However, in the aforementioned case, if only the $W_D/L_D$ of the driver transistor 23 becomes larger, the operating point will be shifted and therefore the $W_L/L_L$ of the load transistor 24 will also be increased. Consequently, as evident in Eq.(3), consumption current increases. Also, consumption current become larger toward the latter stage. Therefore, when a still image is photographed, it is effective that an excess of current is saved near the latter stage.

There are considered some methods of reducing consumption current.

The first method determines whether source-follower amplifiers are employed in all stages or stages other than the latter stage. This is based on the fact that the consumption current in a multi-stage source follower amplifier circuit is gradually increased toward the latter stage, as previously described. According to this method, when all stages are employed, the band becomes a high band for high-speed drive, but a multi-stage source follower amplifier circuit with a large consumption power can be realized. On the other hand, when the latter stage is not employed, the band can be reduced for low-speed drive and therefore there can be realized a multi-stage source follower amplifier circuit which can suppress consumption current.

Figure 8:
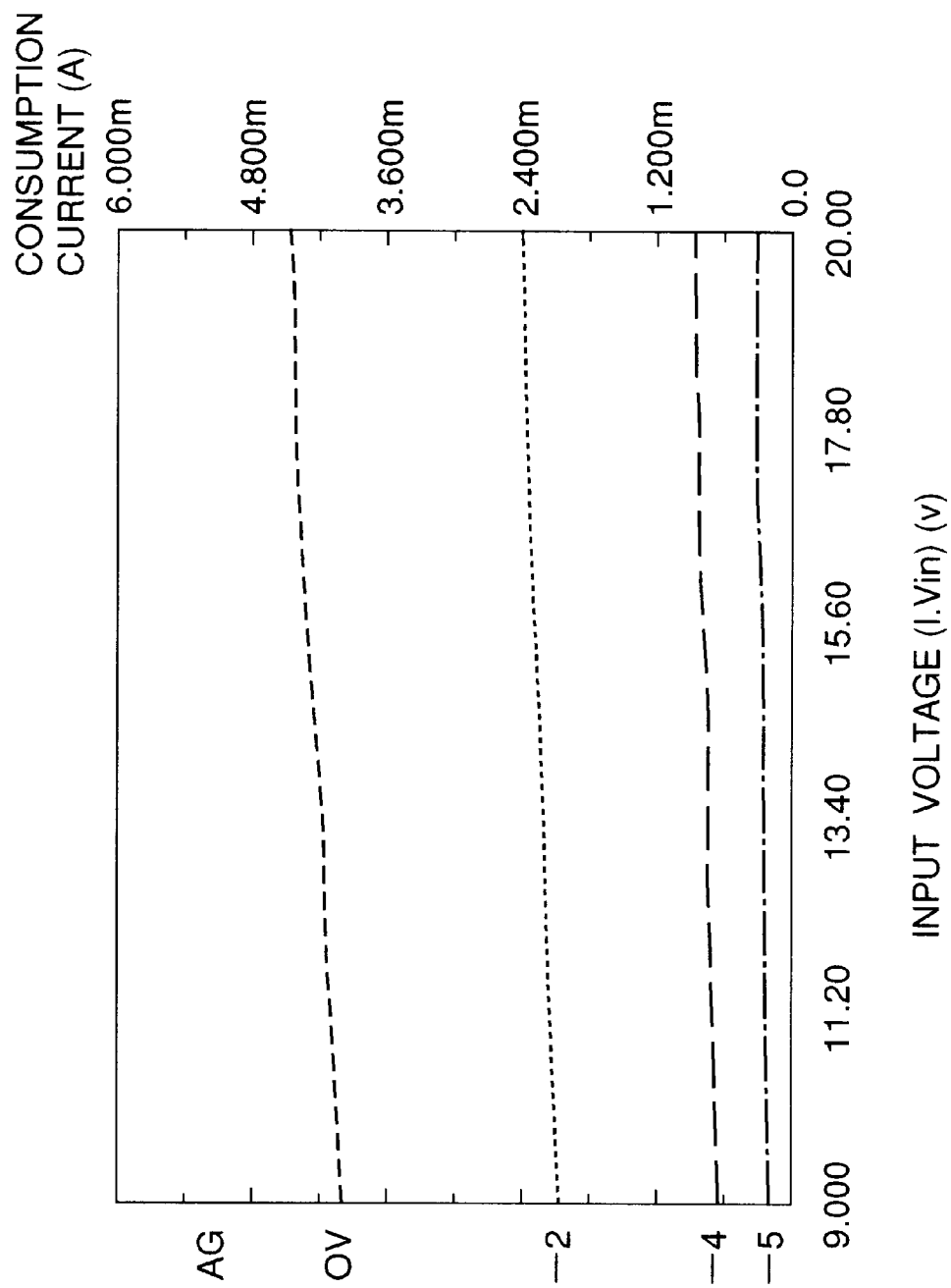
FIG. 8 is a diagram showing the characteristics of the semiconductor device of the second embodiment of the present invention.
Figure 9:
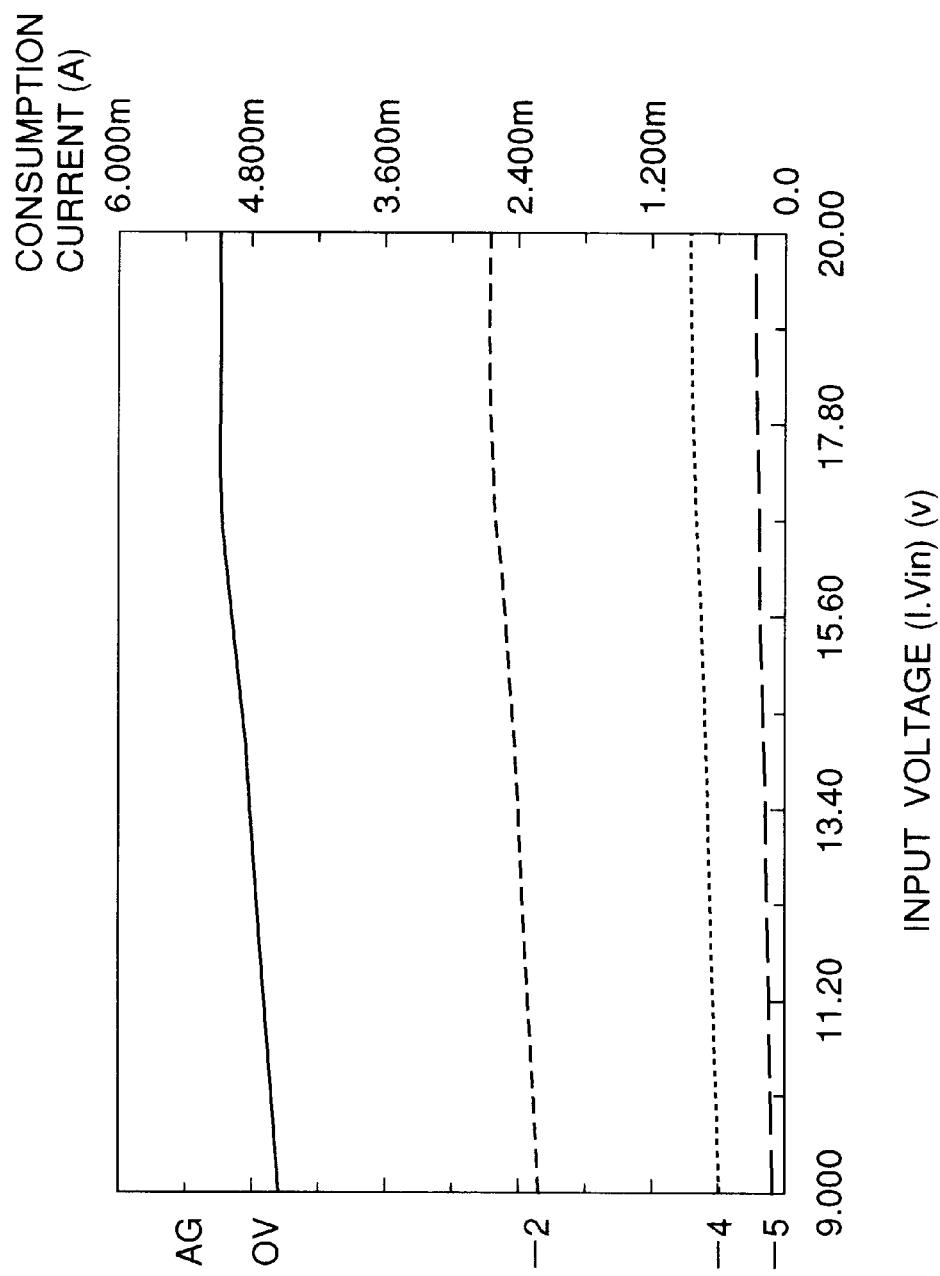
FIG. 9 is a diagram showing the characteristics of the semiconductor device of the second embodiment of the present invention.
Figure 10:
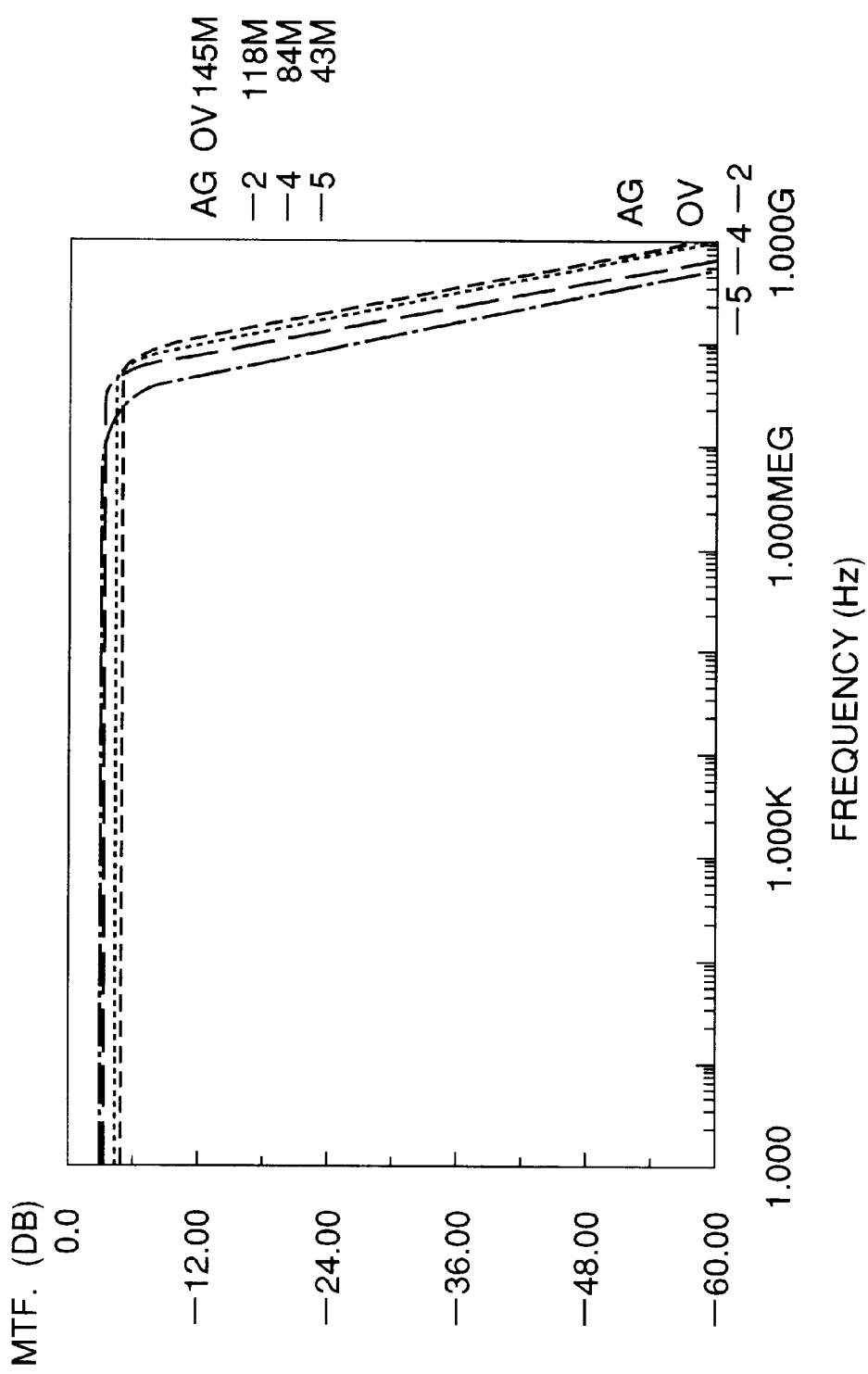
FIG. 10 is a diagram showing the characteristics of the semiconductor device of the second embodiment of the present invention.

The second method adjusts consumption current and a band by making the gate bias of the load transistor of the latter stage variable. From Eq.(3) it follows that consumption current can be varied by the gate bias. If current varies, the operating point $V_o$ will vary and the mutual conductance $gm_D$ will vary. Therefore, from Eq.(2) it follows that the band can be varied. In this case, since both the gain and the operating point vary, both variations become variable within an allowable range. However, since these variations are small as shown in FIGS. 8 through 10, the variations become variable over a considerably wide range. Also, for linearity, the linear region of input-output characteristics will be reduced if an operating point is too low or high, but the operating point of a multi-stage amplifier circuit generally becomes lower toward the latter stage. Therefore, in the case where the gate of the load transistor near the latter stage is made variable, there is no need to consider the limitation on linearity when the operating point is higher. For the limitation on linearity when the operating point is lower, the variation in the operating point is small as previously described and therefore the operating point can be made variable over a considerably wide range.

The third method forms gate electrodes in the transistors of the source-follower amplifier of the latter stage in addition to the original gate electrodes of the transistors, and the lower portion of the additional gate electrode is a surface type. The additional gate electrodes are biased and turned on. That is, this method adjusts gate widths $W_D$ and $W_L$ to adjust consumption current and a band. At this time, gain and an operating point can be held constant by making ratios of gate width reduction equal between a driver transistor and a load transistor. As evident in Eq.(5), it is found that gain is constant. Since an operating point is also determined by the resistance ratio between a driver transistor and a load transistor, it is found that the operating point is constant. Although linearity varies, designs can be performed without causing problems.

Imaging devices according to preferred embodiment of the present invention will hereinafter be described in detail in reference to the drawings.

Figure 1:
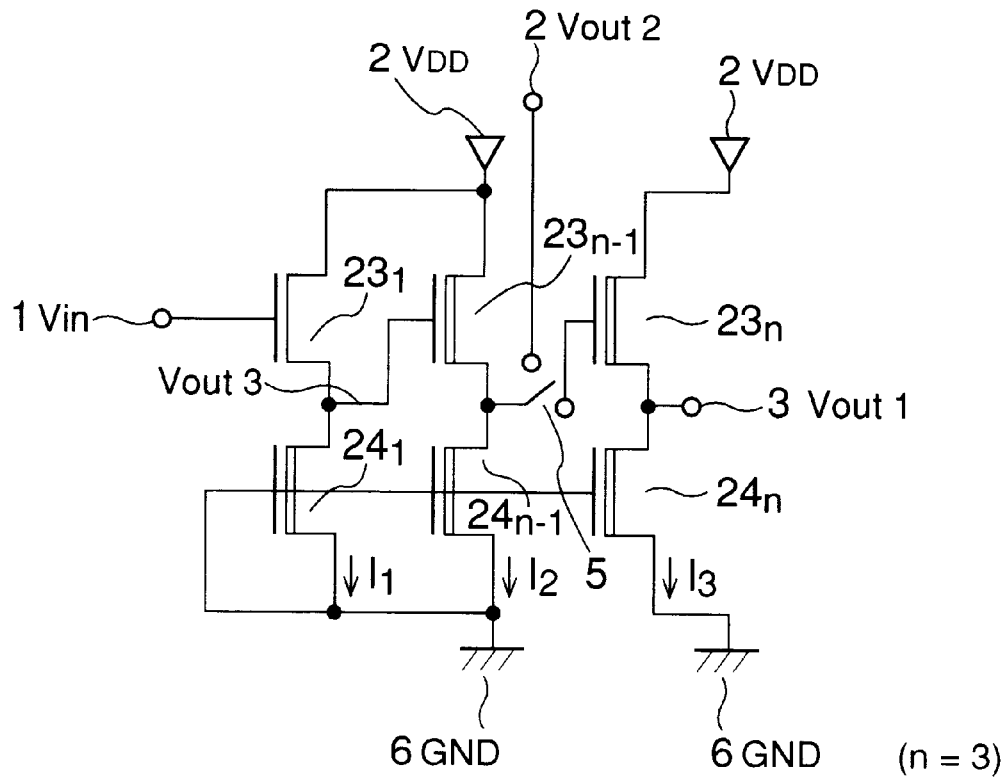
FIG. 1 is a circuit diagram showing the structure of a semiconductor device according to a first embodiment of the present invention.
Figure 15:
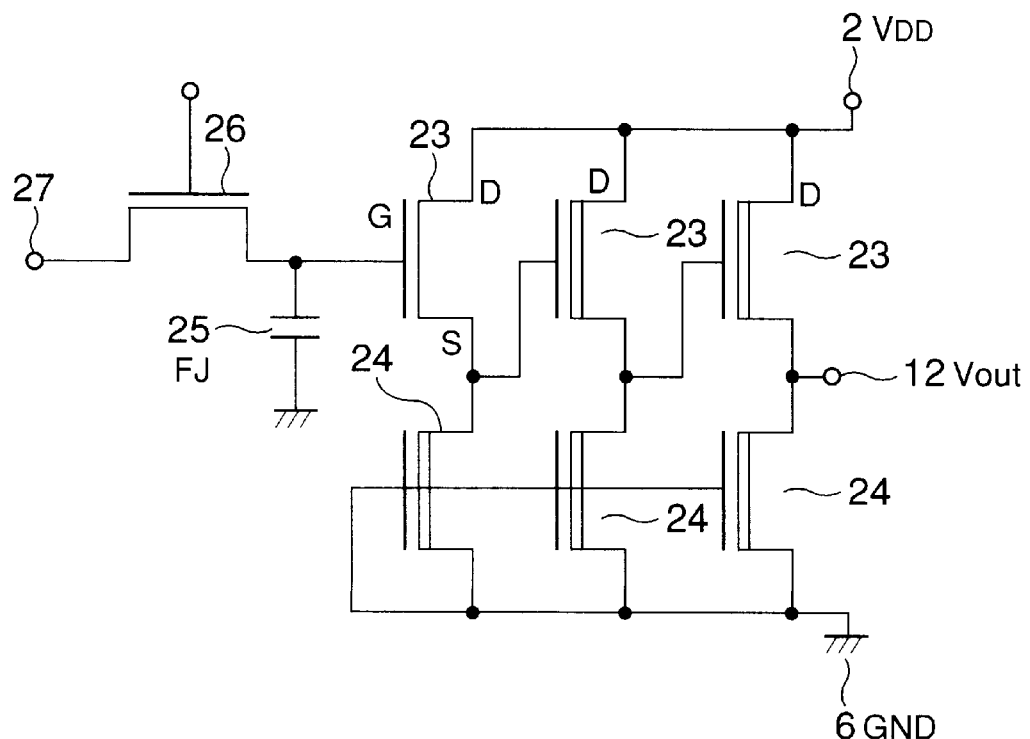
FIG. 15 is a diagram showing the structure of a conventional semiconductor device.

FIG. 1 shows a imaging device according to a first embodiment of the present invention. In the figure, the same reference numerals as FIGS. 15 and 16 are applied to the same parts as the conventional example or corresponding parts and therefore a detailed description is omitted for avoiding redundancy.

Referring to FIG. 1, the imaging device is constituted by 6 N-channel transistors forming source-follower amplifiers of 3 stages (n=3). The upper stage is referred to as driver transistors $23_1$ through $23_n$, and the lower stage is referred to as load transistors $24_1$ through $24_n$.

These transistors comprise buried transistors for noise reduction, except that the driver transistor $23_1$ of the leftmost stage is a surface type for holding linearity. However, since the size is large, there are cases where the driver transistor $23_n$ of the third stage whose noise is small is a surface type.

The sources of the load transistors $24_1$ through $24_n$ are connected to GND terminals 6. The drain of the driver transistor $23_1$ of the first stage is connected to a $V_{DD}$ terminal 2. The source of the driver transistor $23_1$ is connected to the drain of the load transistor $24_1$ and also is connected to the gate of the driver transistor $23_{n-1}$ of the next stage. The drain of the driver transistor $23_{n-1}$ of the second stage is connected to the $V_{DD}$ terminal 2. The source of the driver transistor $23_{n-1}$ is connected to the drain of the load transistor $24_{n-1}$ of the second stage. At the time of low-speed drive, the source of the driver transistor $23_{n-1}$ of the second stage is not connected to the gate of the driver transistor $23_n$ of the next stage, but it is connected to an external circuit in order to take out a signal to the outside (see reference numeral 5 of FIG. 1). On the other hand, at the time of high-speed drive, the source of the driver transistor $23_n$ of the second stage is connected to the gate of the driver transistor $23_n$ of the next stage (see reference numeral 5).

Figure 14:
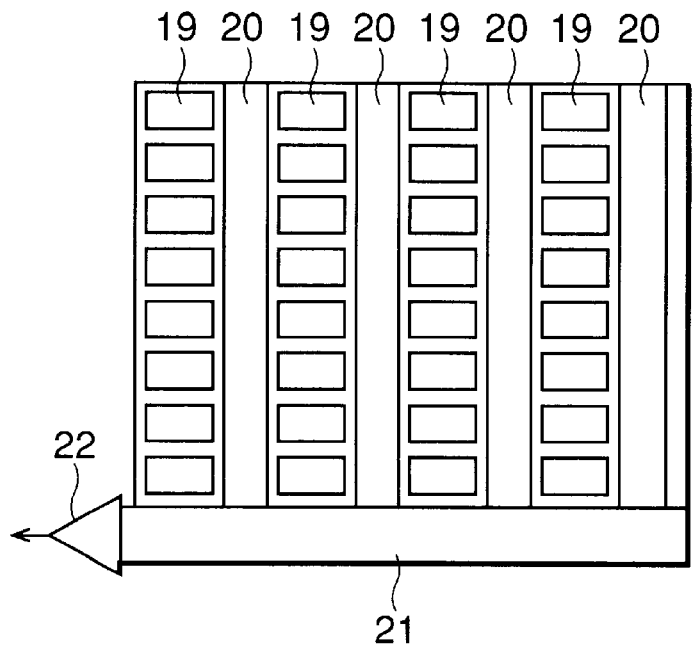
FIG. 14 is a diagram showing the basic structure of a high-vision CCD.

The source of the driver transistor $23_n$ of the final stage is connected to the drain of the load transistor $24_n$. At the time of high-speed drive, the source of the driver transistor $23_n$ is connected to a $V_{out}$ terminal 3 from which a signal is sent to an external circuit. The drain of the driver transistor $23_n$ is connected to the $V_{DD}$ terminal 2. On the other hand, at the time of low-speed drive, the source of the driver transistor $23_n$ is connected to the drain of the load transistor $24_n$. Although not shown, the drain of the driver transistor $23_n$ is also connected to the GND terminal 6 to suppress the consumption current of the source-follower amplifier of the final stage which is not used. The gate of the driver transistor is applied with the photoelectric-converted signal from the horizontal register and connected to the capacitor 25 and reset transistor 26 as shown in FIG. 14 (not shown).

Although not shown, the source-follower amplifier of the third stage is isolated from the source-follower amplifier of the second stage by a field oxide film. This is for avoiding the passage of an output wire over a diffused layer when an output is taken out from the source-follower amplifier of the second stage to an external circuit at the time of low-speed drive. An input signal is applied to a $V_{in}$ terminal 1, which is the gate of the driver transistor $23_1$ of the foremost stage. In the load transistors $24_1$ through $24_n$, the respective gates are biased so that desired currents are obtained as constant current sources. In FIG. 1, the gates are grounded.

Figure 2:
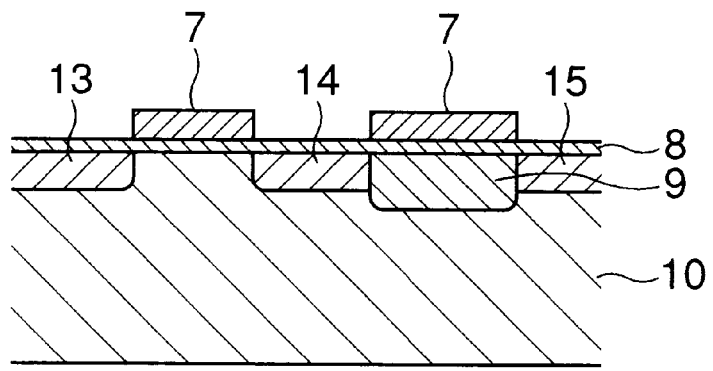
FIG. 2 is a sectional view showing the essential part of the semiconductor device shown in FIG. 1.
Figure 3A:
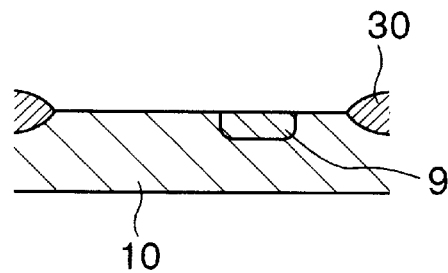
FIGS. 3A–D are diagrams showing the fabrication process of the semiconductor device according to the first embodiment of the present invention.
Figure 3B:
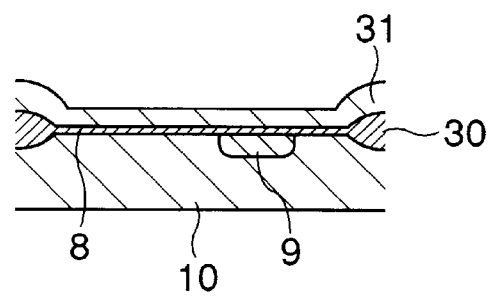
Figure 3C:
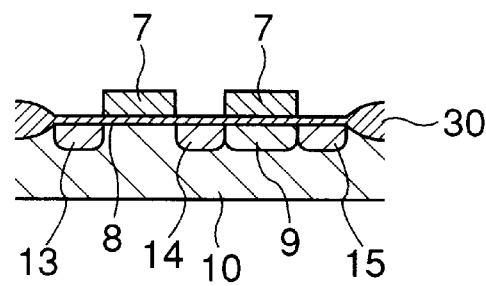
Figure 3D:
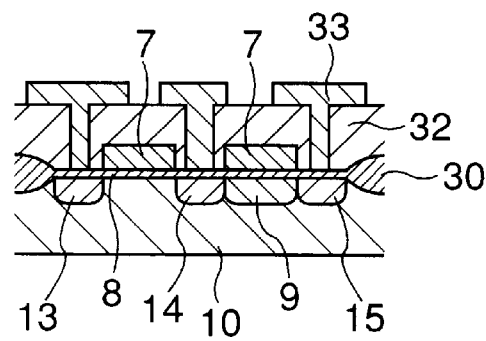

FIG. 2 shows a sectional view of the source-follower amplifier of the first stage in the imaging device shown in FIG. 1. Referring to FIG. 2, each transistor is formed on a P-well 10 of a silicon substrate. In an actual charge-coupled device, the P-well 10 is formed on an N-type silicon substrate and therefore an N-type substrate exists under the P-well 10. However, in FIG. 2 the N-type substrate is omitted on the convenience of explanation. The left driver transistor of FIG. 2 is the surface type where the channel is formed within the P-well 10. On the other hand, other transistors, including the right load transistor of FIG. 2, are the embedded types where an N-well 9 is formed in the upper portion of the P-well 10 and where the channels are formed within the N-well 9. Between surface types or between embedded types, they have the same structure for process simplification, except that the gate lengths and the gate widths differ. The gate insulating film 8 has a structure consisting of only a silicon dioxide film or a structure (called an ONO structure) interposing a silicon nitride film between silicon dioxide films. A gate film 7 consists of polysilicon, and an N-type impurity such as phosphorus is diffused to reduce the resistance of the gate film 7 to the extent that the gate film 7 can be regarded as metal. The diffused layers of a source 15 and a drain 13 are formed by doping an N-type impurity such as phosphorus. Ion implantation is performed on the order of a few hundred-keV and $1 \times 10^{12}$ ions/cm$^2$ to form the regions of the P-well 10 and the N-well 9.

FIGS. 3A–D show the fabrication process of the imaging device according to the first form of the present invention. First, in FIG. 3A, after formation of a field oxide film 30 on a silicon substrate, a P-well 10 and an N-well 9 are formed. Then, in FIG. 3B, a gate oxide film 8 and a phosphorus-doped N-type polysilicon film 31 are formed. Next, in FIG. 3C, after formation of gate electrodes 7 by etching, diffused layers 13, 14, and 15 are formed. Finally, in FIG. 3D, after formation of an intervening insulating layer 32, contact holes are formed and wiring is performed by an aluminum wiring layer 33. The aforementioned processes are substantially identical with the conventional amplifier fabrication processes, except that the wiring pattern for forming the aluminum wiring layer 33 differs.

Figure 4A:
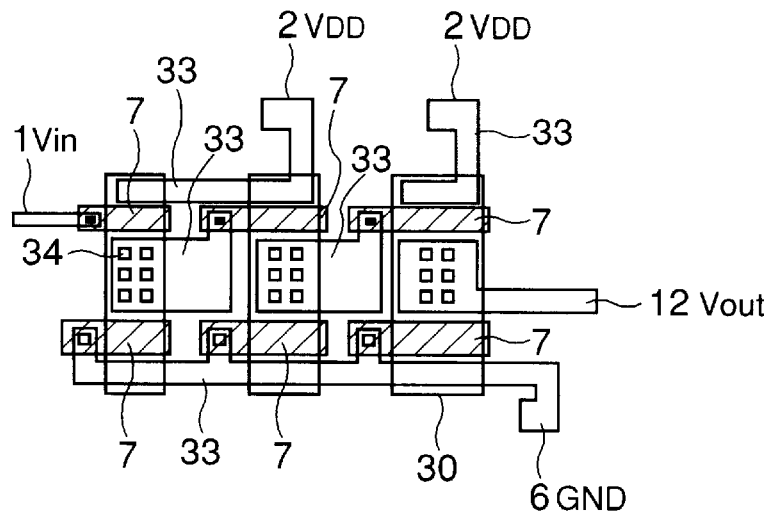
FIGS. 4A–C are top views showing the output amplifier circuits.
Figure 4B:
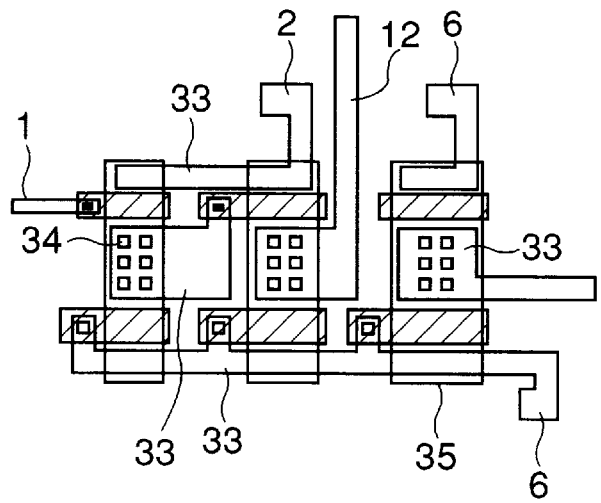
Figure 4C:
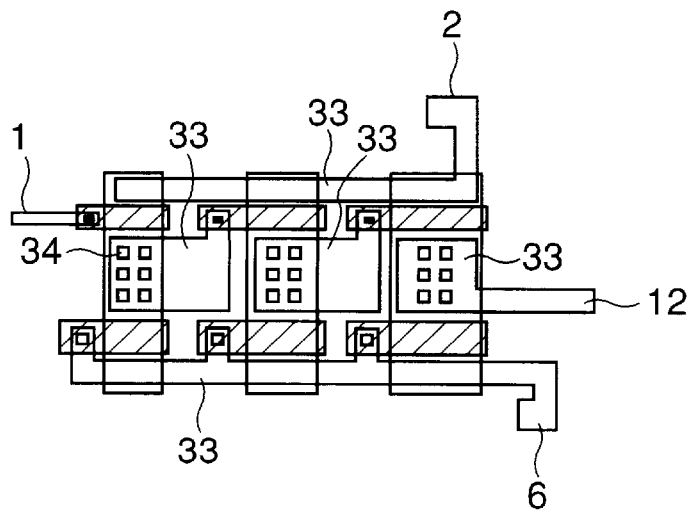

FIGS. 4A and B show the wiring pattern of the imaging device of the first form of the present invention, and FIG. 4C shows the wiring pattern of a conventional imaging device as a comparative example.

FIG. 4A shows a three-stage source-follower amplifier circuit constructed by a wiring pattern which is used for high-speed drive, for example, in the case where source-follower amplifiers are used in the amplifier circuit of a CCD for photographing a dynamic image.

Each $V_{DD}$ terminal 2 of he respective source-follower amplifiers of selection candidates (i.e., the source-follower amplifiers of the second and third stages) is another wire (in this example, the first stage is not a selection candidate.). Between the source-follower amplifiers of the two selection candidates, that is, between the source-follower amplifiers of the second and third stages, large spacing is ensured. The $V_{DD}$ terminal 2 and the GND terminal 6 is connected to an internal $V_{DD}$ line and an internal GND line respectively on chip.

FIG. 4B shows a two-stage source-follower amplifier circuit constructed by a wiring pattern which is used for low-speed drive, for example, in the case where source-follower amplifiers are used in the amplifier circuit of a CCD for photographing a still image.

In the case where all stages are not employed, such as the case of the two-stage source-follower amplifier circuit shown in FIG. 4B, the GND terminal 6 is used in the source-follower amplifier of the stage (the third stage in FIG. 4B) which is not used, instead of the $V_{DD}$ terminal. With this arrangement, the consumption current of the source-follower amplifier that is not employed is made 0 A.

In the imaging device shown in FIG. 4B, when source-follower amplifiers are made as a two-stage structure, it is possible to easily take out an output from the second stage source-follower amplifier ($V_{out}$ terminal 12), as shown in FIG. 4B, and also an occurrence of noise resulting from a power source can be prevented.

On the other hand, in FIG. 4C, the $V_{DD}$ terminal 2 is common to the first through the third stages and the spacings between them are identical. Width of gate electrodes 7 of transistors each of stages are changed respectively as shown. Reference numeral 35 denotes the boundary line of the field oxide film, and reference numeral 34 denotes a contact hole.

The output amplifiers in FIG. 4A and 4B is previously made by the respective mask before it is composed as an amplifier of the CCD. On the other hand, besides selecting mode by masks, selecting in a still image photographing mode or dynamic image photographing mode may carry out by a switch circuit outputing a mode selecting signal (not shown). The output amplifier selecting mode by an mode switching circuit does not need two types of mask and the CCD camera having the output amplifier selecting mode by an mode switching circuit can select mode in using the camera.

Figure 5:
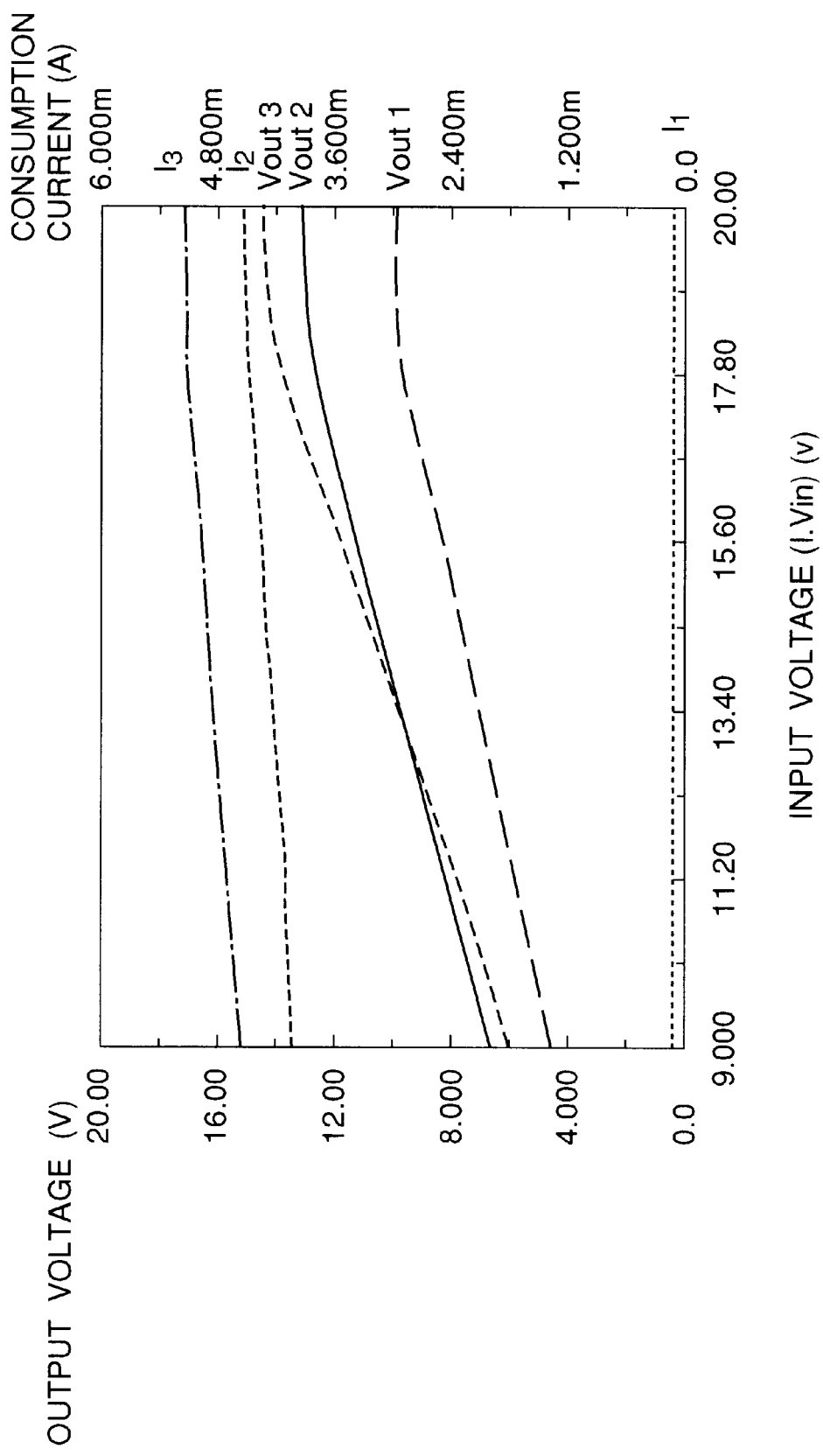
FIG. 5 is a diagram showing the characteristics of the semiconductor device of the first embodiment of the present invention.

FIG. 5 is shown the input-output characteristic and the consumption current of the imaging device according to the first embodiment of the present invention.

For the gate width ($\mu$m)/gate length ($\mu$m) of each transistor, the drive transistors have 8/4, 80/4, and 800/4.5 from the first stage, and the load transistors have 10/26, 110/10, and 150/10 from the first stage.

In the case of an input voltage of 14 V, the consumption current of three stages is 10 mA in total. Also, the gain is 0.63, and the band is 145 MHz at a 3-dB-down frequency. On the other hand, when an output is taken out from the second stage, the consumption current is 5 mA. The gain is 0.71, and the 3-dB-down frequency is 42 MHz. The voltage on the $V_{DD}$ terminal is 15 V.

Figure 6:
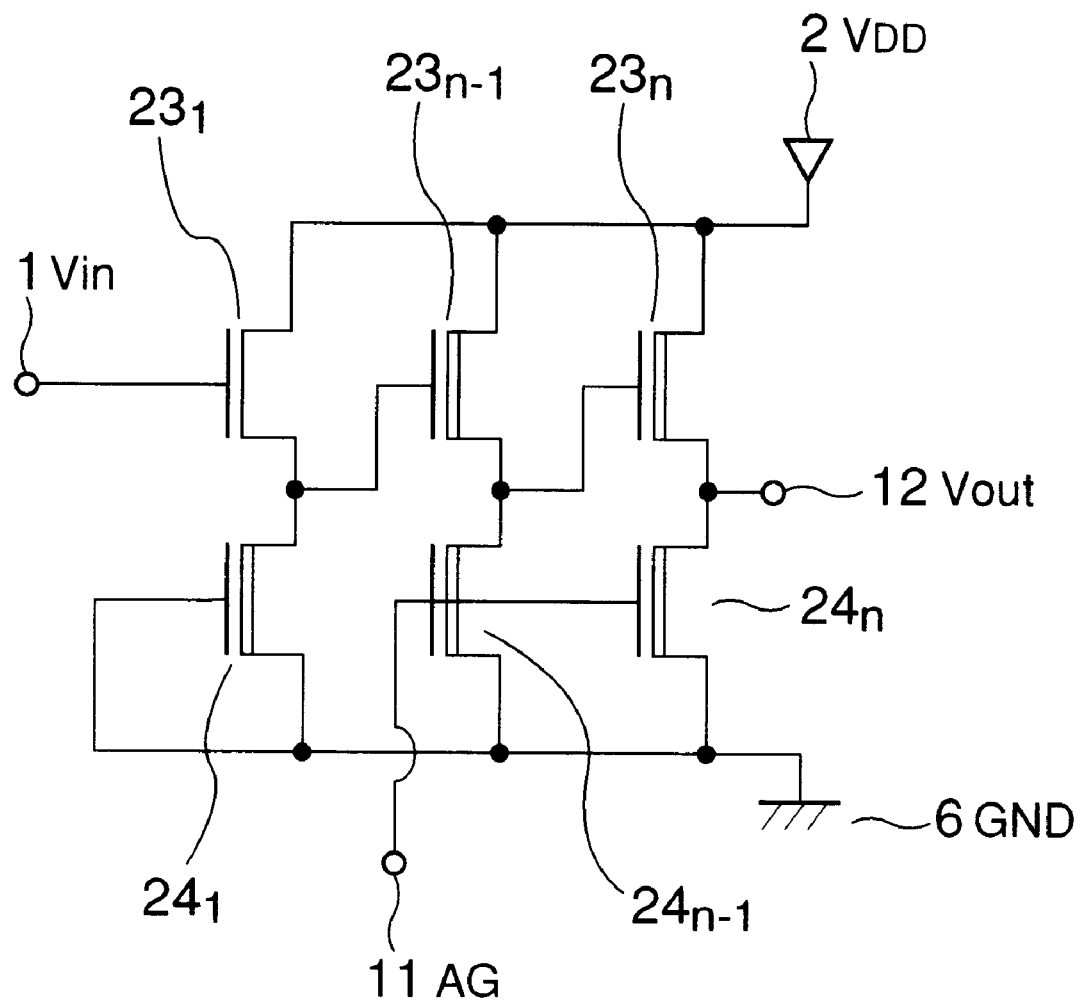
FIG. 6 is a circuit diagram showing a semiconductor device according to a second embodiment of the present invention.

FIG. 6 shows a circuit diagram of a imaging device according to a second embodiment of the present invention.

The imaging device according to the second embodiment of the present invention is constituted by 6 N-channel transistors which form source-follower amplifiers of 3 stages (n=3). The upper stage consists of driver transistors $23_1$ through $23_n$, and the lower stage consists of load transistors $24_1$ through $24_n$. Reference numeral 1 denotes a $V_{in}$ terminal, reference numeral 2 a $V_{DD}$ terminal, reference numeral 6 a GND terminal, and reference numeral 12 a $V_{out}$ terminal.

The source-follower amplifier of the third stage is not isolated from the preceding stages by a field oxide film. The output of the source-follower amplifier of the second stage is connected to the gate of the driver transistor $23_n$ of the third stage. The gates of the load transistors $24_{n-1}$ and $24_n$ of the second and third stages are connected to an AG terminal 11 so that they can be biased variably. The level of the AG terminal is controlled by the mode switching circuit (not shown). With this arrangement, the consumption power and the band can be varied continuously.

Here, when the band is reduced by source-follower amplifiers of three stages, consumption current can be made smaller compared with a two-stage source-follower amplifier circuit having the same band. This is because, in the case of a three-stage structure, the load capacity of the second stage which is not the final stage becomes smaller (the load capacity of the final stage becomes an external capacity and therefore is large) and therefore the consumption current of the second stage can be made smaller. Furthermore, the reason why consumption current can be made smaller is that, as evident in the described contents in the aforementioned band fixing means, the mutual conductance of the driver transistor of the third stage is larger than that of the driver transistor of the second stage and therefore consumption current can be made smaller by the surplus amount.

The CCD camera having the output amplifier selecting mode by an mode switching circuit can select mode in using the camera.

Figure 7:
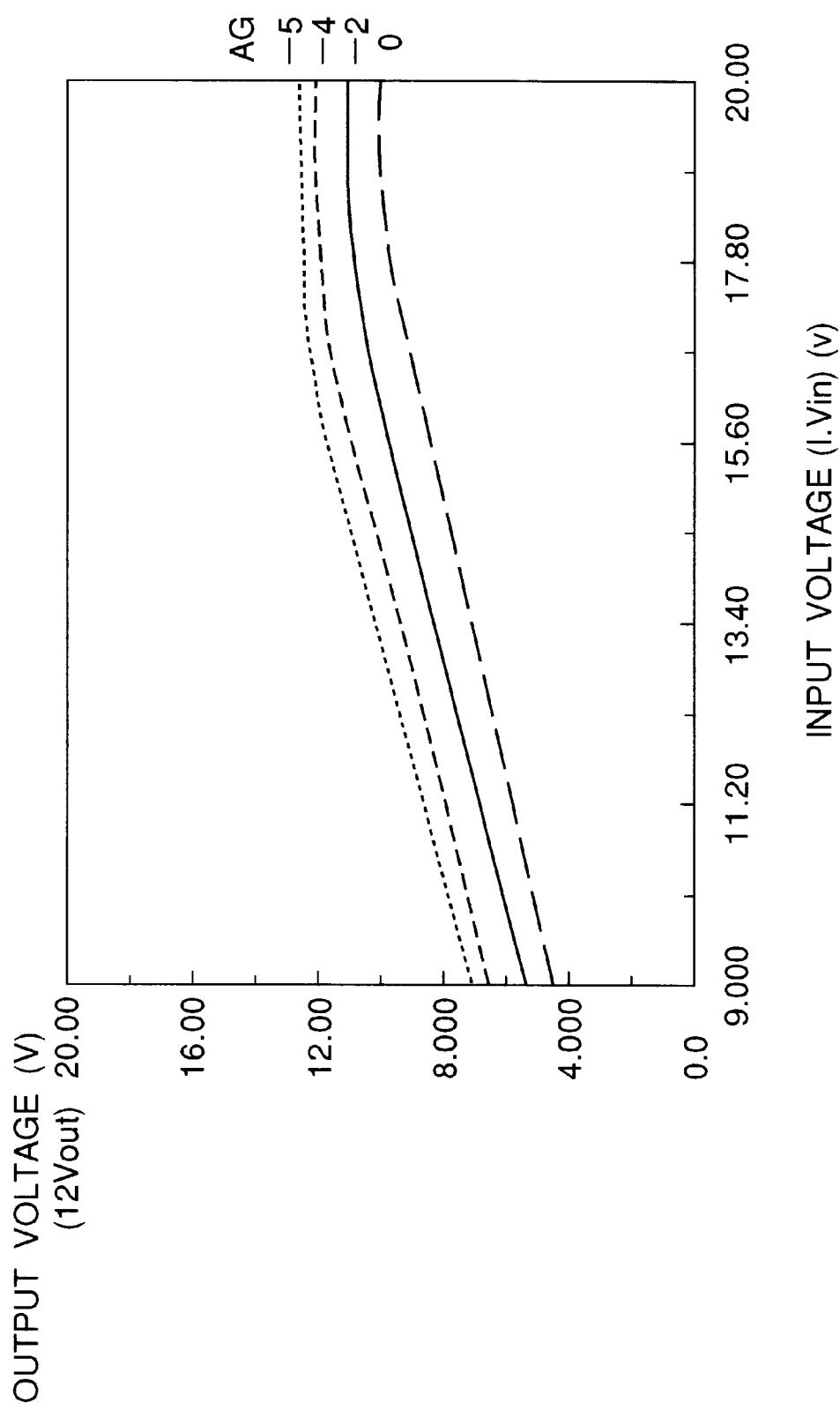
FIG. 7 is a diagram showing the characteristics of the semiconductor device of the second embodiment of the present invention.

FIG. 7 shows the output of the case where the voltage on the gate bias AG of the load transistors of the second and third stages is varied between –5 V and 0 V. FIG. 8 shows the consumption current of the second stage, FIG. 9 shows the consumption current of the third stage, and FIG. 10 shows the 3-dB-down frequency. The characteristics of the imaging device according to the second embodiment of the present invention are verified. The gate width/gate length of each transistor is made identical with that of the first embodiment of the present invention.

Referring to FIG. 10, the 3-dB-down frequency is 43 MHz at –5 V and 145 MHz at 0 V. The consumption currents at that time are 1 mA and 10 mA, respectively. The variations in the gain and the operating point are within an allowable range. Also, as compared with the characteristics of the source-follower amplifier of the second stage of the aforementioned first form of the present invention, it is found that the consumption current is reduced from 5 mA to 1 mA in the same band.

The imaging device according to the second embodiment of the present invention can be realized even by a imaging device including only a source-follower amplifier of a single stage.

Figure 11A:
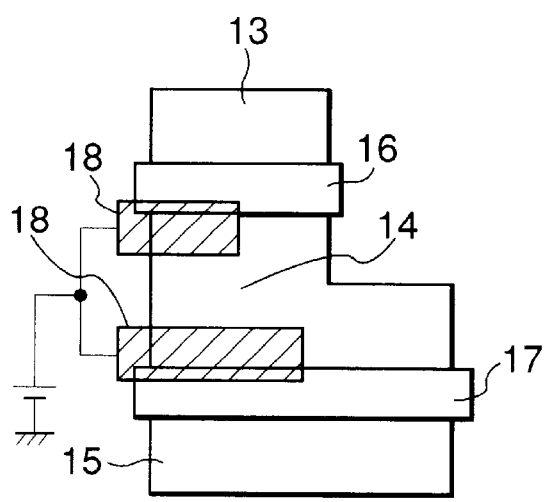
FIG. 11A–B are top view showing final stage of the output amplifier circuits.
Figure 11B:
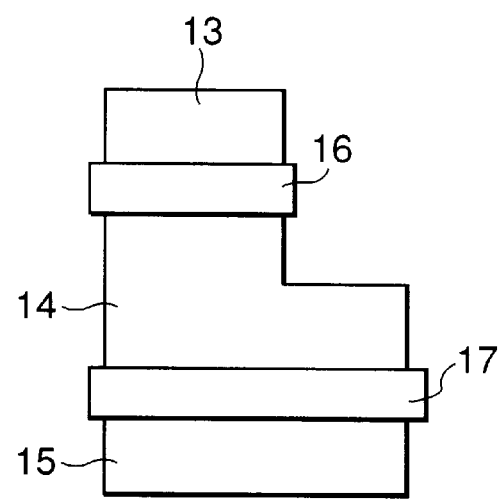

A imaging device according to a third embodiment of the present invention, although not shown, as with the first embodiment, is constituted by 6 N-channel transistors forming source-follower amplifiers of three stages. The upper stage consists of 3 driver transistors and the lower stage consists of 3 load transistors. FIG. 11A shows a top view of the source-follower amplifier of the third stage of the imaging device according to the third embodiment of the present invention, and FIG. 11B is a top view showing the source-follower amplifier of a conventional imaging device as a comparative example. In FIGS. 11A and B, reference numeral 13 denotes the diffused layer of the drain, and reference numeral 14 denotes the diffused layer of the output section. Reference numeral 15 denotes the diffused layer of the source, reference numeral 16 the gate electrode of the driver transistor, and reference numeral 17 the gate electrode of the load transistor.

In FIG. 11A, the imaging device according to the third embodiment of the present invention is provided with third gate electrodes 18 near the gate electrodes 16 and 17 of the driver transistor and load transistor of the source-follower amplifier of the third stage, and the lower portion of the third gate electrode 18 is a surface type. When a bias voltage is applied and transistors are turned on, the gate electrodes 16 and 17 and the third gate electrodes 18 as a whole constitute a third transistor, which can cope with high-frequency (high-speed) drive. On the other hand, when transistors are turned off, portions other than the third gate electrodes 18 form a transistor, which can cope with low-frequency (low-speed) drive. If the width ratio of the third gate electrode 18 of the driver transistor is made equal to the width ratio of the third gate electrode 18 of the load transistor, the band and the consumption current can be varied in two stages without varying the operating point and the gain. The level supplied to the third gate electrode is controlled by the mode switching circuit (not shown).

The characteristics of the imaging device according to the third embodiment of the present invention are verified. The gate width/gate length of each transistor is made identical with that of the first form of the present invention. Also, the gate width which is turned off by the aforementioned third gate electrode is ¾ of the original gate width. That is, the gate width of the driver transistor of the third stage is substantially 200 μm, and the gate width of the load transistor is 47.5 μm.

Figure 12:
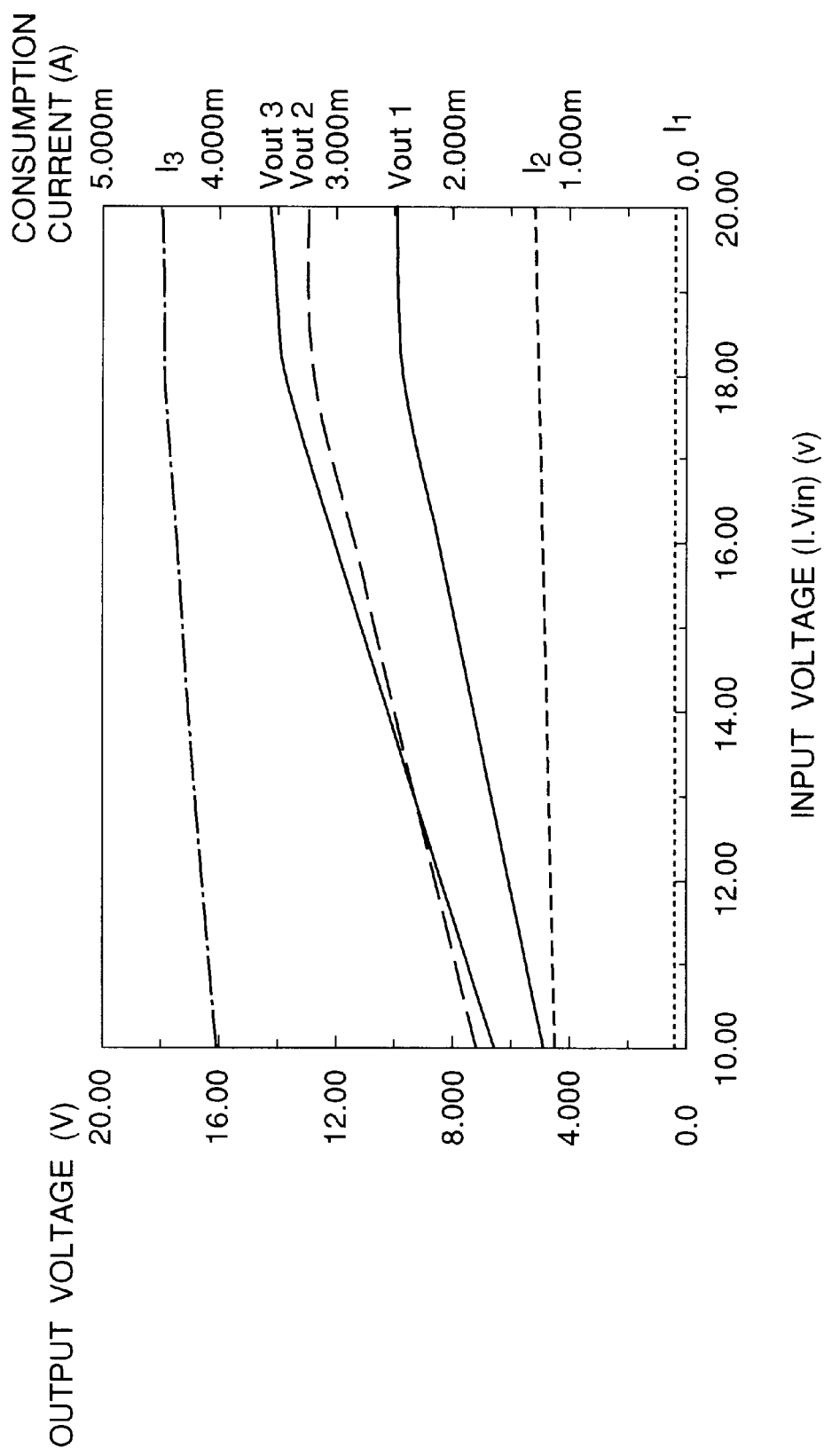
FIG. 12 is a diagram showing the characteristics of the semiconductor device of the third embodiment of the present invention.
Figure 13:
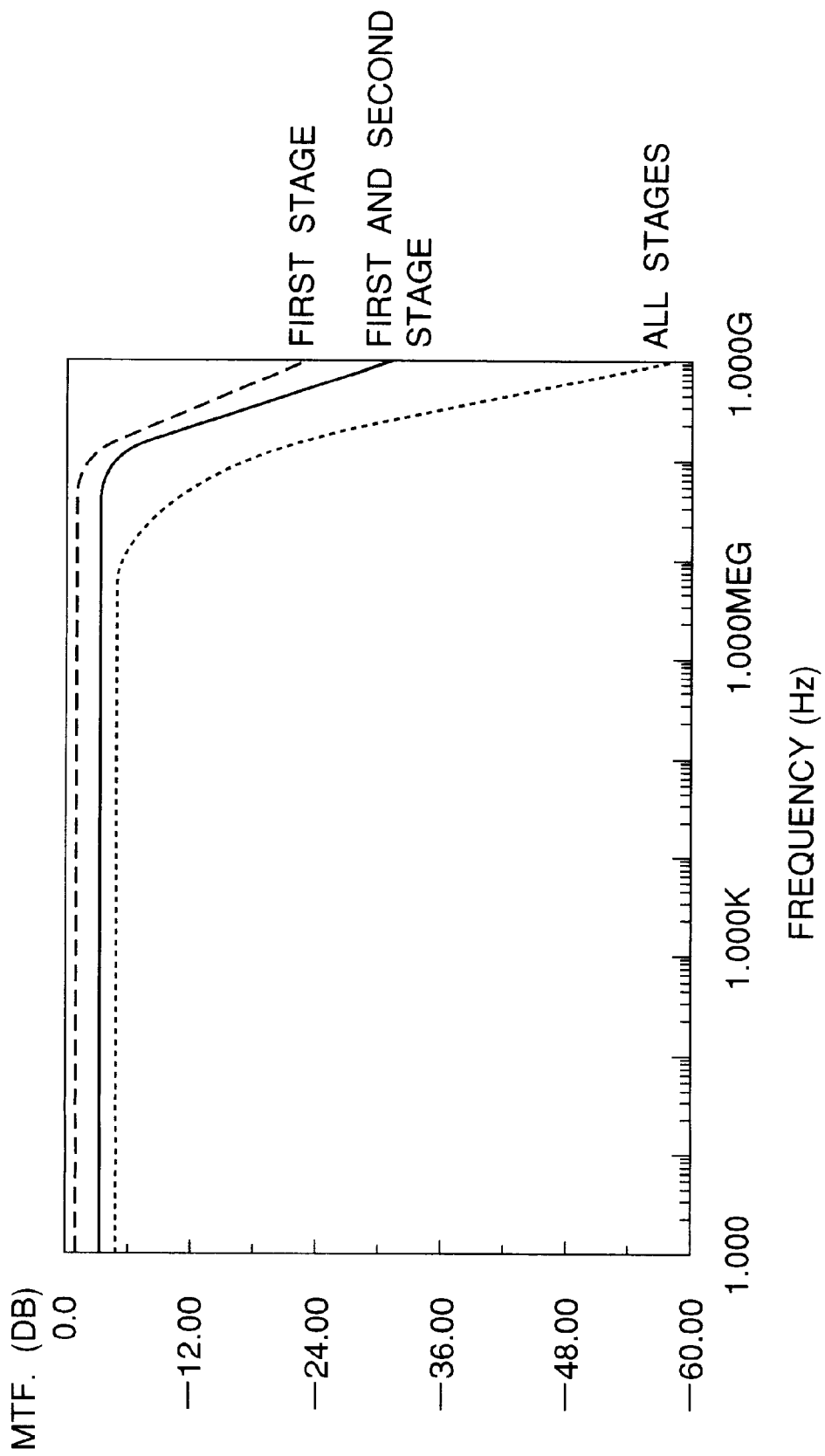
FIG. 13 is a diagram showing the characteristics of the semiconductor device of the third embodiment of the present invention.

FIG. 12 shows the characteristics of the output current and the consumption current when the third gate electrode is turned off, and FIG. 13 shows the band characteristic. The gain and the operating point remain unchanged, and the band is reduced to 33 MHz and the consumption current is reduced to 5 mA.

The structure of the third embodiment of the present invention is not limited to the source-follower amplifier of the final stage but may be applied to the following stages including the final stage. The imaging device according to the third embodiment of the present invention can also be realized even by a imaging including only a source-follower amplifier of a single stage.

While the aforementioned embodiments of the present invention have been described with reference to on-chip amplifiers which are applied to a CCD, the present invention is not limited to the on-chip amplifiers but is applicable to general multi-stage source-follower amplifiers. Also, although the present invention has been applied to N-channel transistors, the invention is applicable to P-channel transistors with simple change.

While the present invention has been described with reference to preferred forms thereof, the invention is not to be limited to the details given herein, but may be modified within the scope of the appended claims.

What is claimed is:

1. An imaging device comprising
   an amplifier circuit receiving an input signal and producing an output signal, said amplifier circuit comprising a first source-follower amplifier receiving said input signal to produce a first internal output signal, a second source follower amplifier amplifying an internal input signal to produce a second internal output signal, and
   means for changing gain bandwidth product of said amplifier circuit.

2. The imaging device as claimed in claim 1, wherein said means for changing gain bandwidth product includes means for changing consumption current consumed by said amplifier circuit in accordance with said input signal.

3. The imaging device as claimed in claim 1, wherein said changing means comprise an output terminal and a switch supplying said first internal output signal into said output terminal to output said output signal from said output terminal in first mode and supplying said first internal output signal into said second source-follower amplifier as said internal input signal to output said second internal output signal as said output signal in second mode.

4. The imaging device as claimed in claim 3, wherein said first mode is a still image photographing mode and said second mode is a dynamic image photographing mode.

5. The imaging device as claimed in claim 1, wherein said first internal output signal is said internal input signal, said second source-follower amplifier has a load transistor having a control gate, and said changing means change a bias voltage applied to said control gate.

6. The imaging device as claimed in claim 1, wherein said first output signal is said internal input signal, said second source-follower amplifier comprises a drive transistor having a first control electrode supplied with said internal input signal and a second control electrode and a load transistor having a third control electrode supplied with a first bias voltage and a fourth control gate, and said changing means supplying said second control electrode and said fourth control electrode with a second bias voltage in a first mode and with a third bias voltage in a second mode.

7. An imaging device having an output amplifier circuit amplifying an input signal to produce an output signal, said output amplifier circuit comprising,
   a first power supply terminal,
   a second power supply terminal,
   first and second nodes,
   a first transistor of a first channel type connected between said first power supply terminal and said first node and having a first control electrode receiving an input signal,
   a second transistor of said first channel type connected between said first node and said second power supply terminal and having a second control electrode,
   a third transistor of said first channel type connected between at least one of said first power supply terminal and said second power supply terminal and said second node and having a third control electrode,
   a fourth transistor of said first channel type connected between said second node and said second power supply terminal and having a fourth control electrode, and
   means for changing gain bandwidth product of said amplifier circuit.

8. The imaging device as claimed in claim 7, wherein said second control electrode is connected to said second power supply terminal, said fourth control electrode is connected to said second power supply terminal, and said changing means changes to connect said first node to a third node so as to output said output signal from said third node or to connect said first node to a third control electrode so as to output said output signal from said second node.

9. The imaging device as claimed in claim 7, wherein said first node is connected to said third control electrode and changing means changes a voltage level of a bias voltage supplied to said fourth control electrode.

10. The imaging device as claimed in claim 7, wherein said first node is connected to said third control electrode, said third transistor has a first extra control electrode and said fourth transistor has a second extra control electrode, and said first extra control electrode and said second extra control electrode are supplied with a first bias voltage in a first mode and with a second bias voltage in a second mode.

11. A method of forming an output amplifier used in an imaging device, comprising the steps of;

forming a first gate electrode of a first MOS transistor, a second gate electrode of a second MOS transistor, a third gate electrode of a third MOS transistor, and a fourth gate electrode of a fourth MOS transistor;

forming, by using a first mask, a GND line connected to said second gate electrode, said fourth gate electrode, a source of said second MOS transistor, and a source of said fourth MOS transistor, a Vdd line connected to a source of said first MOS transistor and a source of said third MOS transistor, a signal line connected to drain electrodes of said first and second MOS transistors with said third gate electrode, and an output line connected to drain electrodes of said third and fourth MOS transistors when said imaging device is set in a still picture selected mode; and forming, by using a second mask, a first GND line connected to said second gate electrode, said fourth gate electrode, a source of said second MOS transistor, and a source of said fourth MOS transistor, a Vdd line connected to a source of said first MOS transistor, a second GND line connected to a source of said third MOS transistor, and output line connected to drain electrodes of said first and second transistors when said imaging device is set in a moving picture selected mode.

12. An imaging device comprising:

an amplifier circuit receiving an input signal and producing an output signal, said amplifier circuit comprising:

a plurality of source follower-amplifiers connected in series so that the first source-follower amplifier of said plurality of source-follower amplifiers receives said input signal, each of said plurality of source-follower amplifiers except said first source-follower amplifier receives an output of a preceding source-follower amplifier, and a final source-follower amplifier produces said output signal, and a means for changing gain bandwidth product and consumption current of said amplifier circuit.

13. The imaging device as recited in claim 12 wherein said means for changing gain bandwidth product and consumption current further comprises means for changing a number of said plurality of source-follower amplifiers connected in series.

14. The imaging device as recited in claim 12, wherein said final source-follower amplifier has a load transistor having a control gate and said means for changing gain bandwidth product and consumption current includes means for changing a bias voltage on said control gate of said load transistor of said final source-follower amplifier.

15. The imaging device as recited in claim 14, wherein another source-follower amplifier has a load transistor having a control gate and said means for changing gain bandwidth product and consumption current includes means for changing a bias voltage on said control gate of said load transistor of said another source-follower amplifier.

16. The imaging device as recited in claim 12, wherein said final source-follower amplifier includes a driver transistor and a load transistor, each of said driver transistor and said load transistor having a first gate electrode controlling a conduction channel and a second gate electrode controlling a portion of a width of said conduction channel and wherein said means for changing said gain bandwidth product and consumption current of said amplifier circuit includes means for applying a bias to said second gate electrode of said driver transistor and said load transistor of said final source-follower amplifier.

17. An imaging device comprising:

an amplifier circuit receiving an input signal and producing an output signal, said amplifier circuit comprising:

at least one source-follower amplifier circuit having a driver transistor and a load transistor, each of said driver transistor and said load transistor having a first gate electrode controlling a conduction channel and a second gate electrode controlling a portion of a width of said conduction channel and wherein said means for changing said gain bandwidth product and consumption current of said amplifier circuit includes means for applying a bias to said second gate electrode of said driver transistor and said load transistor of said at least one source-follower amplifier.

18. The imaging device as recited in claim 17, wherein a width ratio of said second gate electrode to a width of said conduction channel of said driver transistor is equal to a width ratio of said second gate electrode to a width of said conduction channel of said load transistor.

* * * * *